(12) United States Patent
Kubo

(10) Patent No.: US 8,567,040 B2
(45) Date of Patent: Oct. 29, 2013

(54) IRON CORE, IRON CORE MANUFACTURING METHOD, ALIGNMENT APPARATUS, AND EXPOSURE APPARATUS

(75) Inventor: Hiroyoshi Kubo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 845 days.

(21) Appl. No.: 12/237,254

(22) Filed: Sep. 24, 2008

(65) Prior Publication Data

US 2009/0007419 A1  Jan. 8, 2009

Related U.S. Application Data

(62) Division of application No. 11/436,573, filed on May 19, 2006, now Pat. No. 7,561,016, which is a division of application No. 10/809,460, filed on Mar. 26, 2004, now Pat. No. 7,084,731.

(30) Foreign Application Priority Data

Apr. 1, 2003  (JP) .................................. 2003-098036

(51) Int. Cl.
*H01S 4/00*  (2006.01)
(52) U.S. Cl.
USPC ................ 29/592.1; 29/604; 29/841; 29/855; 336/234
(58) Field of Classification Search
USPC ................. 29/602.1, 596–598, 25.35–25.42; 336/233–234; 310/254, 259
See application file for complete search history.

(56) References Cited

U.S. PATENT DOCUMENTS

| | | | |
|---|---|---|---|
| 3,336,662 A | | 8/1967 | Bradford Howland et al. |
| 3,813,763 A | * | 6/1974 | Church ............................ 29/596 |
| 4,548,853 A | * | 10/1985 | Bryan ............................ 428/131 |
| 5,176,946 A | * | 1/1993 | Wieloch ......................... 428/138 |
| 5,546,652 A | * | 8/1996 | Ogata et al. ...................... 29/738 |
| 5,783,880 A | | 7/1998 | Teshima et al. |
| 5,858,587 A | | 1/1999 | Yamane et al. |
| 6,653,924 B2 | | 11/2003 | Vinciarelli et al. |
| 6,664,703 B2 | | 12/2003 | Oketani et al. |
| 6,841,908 B2 | | 1/2005 | Hasegawa et al. |
| 7,084,731 B2 | * | 8/2006 | Kubo ............................. 336/234 |
| 7,561,016 B2 | * | 7/2009 | Kubo ............................. 336/234 |
| 2003/0007140 A1 | | 1/2003 | Korenaga |

FOREIGN PATENT DOCUMENTS

| | | |
|---|---|---|
| JP | 2-251439 A | 10/1990 |
| JP | 6-233481 | 8/1994 |
| JP | 8-229759 | 9/1996 |
| JP | 2002-260916 A | 9/2002 |
| JP | 2003-22960 A | 1/2003 |

OTHER PUBLICATIONS

Japanese Office Action dated Oct. 3, 2008 in corresponding Japanese Patent Application No. 2003-098036.

* cited by examiner

*Primary Examiner* — Minh Trinh
(74) *Attorney, Agent, or Firm* — Fitzpatrick, Cella, Harper & Scinto

(57) ABSTRACT

An iron core includes an electromagnetic steel plate having a first region on the surface of which an insulating film is formed and a second region which is not covered with the insulating film and exposed, and a coating member which coats at least the second region. The second region is formed by removing the insulating film by machining.

4 Claims, 22 Drawing Sheets

FIG. 1A
FIG. 1B
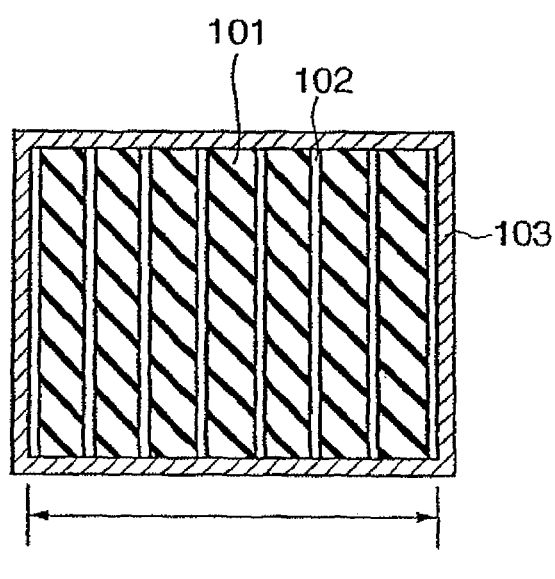
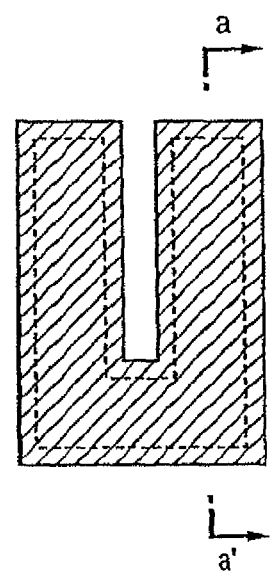

FIG. 2A
FIG. 2B
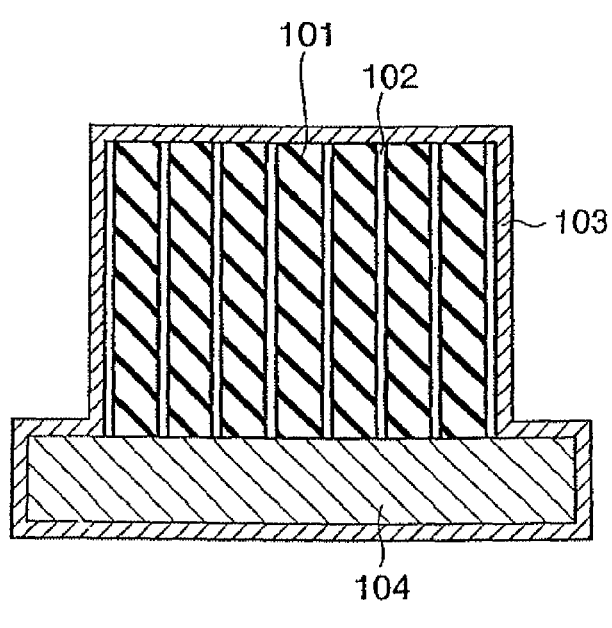
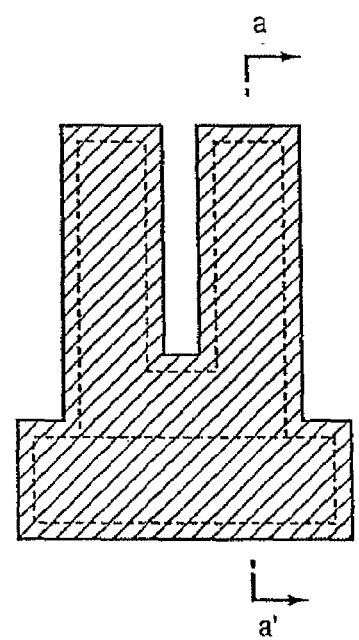

101  105

105
101

IRON CORE, IRON CORE MANUFACTURING METHOD, ALIGNMENT APPARATUS, AND EXPOSURE APPARATUS

This application is a divisional of application Ser. No. 11/436,573, filed on May 19, 2006 (pending), which is a divisional of application Ser. No. 10/809,460, filed on Mar. 26, 2004, now U.S. Pat. No. 7,058,705, issued on Aug. 1, 2006.

FIELD OF THE INVENTION

The present invention relates to an iron core, a method of manufacturing the same, an alignment apparatus, and an exposure apparatus using the alignment apparatus.

BACKGROUND OF THE INVENTION

A conventional alignment apparatus is disclosed in, for example, Japanese Patent Application Laid-Open No. 8-229759. FIG. 9 is a perspective view of an X-Y stage as this conventional alignment apparatus. A platen 42 has a reference surface 43 for supporting stage devices such as an X stage 32 and Y stage 37. A fixed Y guide 38 is fixed to the platen 42 and has a side surface as a reference surface. The Y stage 37 as a moving member is guided by the fixed Y guide 38 and moved in the Y direction by a Y linear motor 41. The Y linear motor 41 includes a Y linear motor stator 39 and Y linear motor movable element 40. The X stage 32 has an X linear motor movable element (not shown), and is guided in the X direction by an X guide 33 formed on the Y stage 37. The X stage 32 is given a driving force in the X direction by an X linear motor stator 34 formed on the Y stage 37.

As shown in FIG. 9, a top plate 31 mounted on the X stage 32 can be formed into the shape of a plate. On the top plate 31, an X-direction mirror 45 and Y-direction mirror 46 for measuring positions in the X and Y directions, respectively, are mounted. The X- and Y-direction mirrors 44 and 46 are irradiated with laser beams to measure positions in the X and Y directions, respectively, on the basis of the reflected light. The conventional X-Y stage may also be moved in the Z direction parallel to the exposure light path and in directions ($\theta x, \theta y, \theta z$) around the X, Y, and Z axes by sing a $\theta$ZT driving mechanism 200 shown in FIG. 11.

FIG. 10 is a view showing the state in which the $\theta$ZT driving mechanism 200 shown in FIG. 11 is removed from the conventional X-Y stage. The $\theta$ZT driving mechanism 200 is mounted on the upper surface of an X-stage top plate 51a of an X stage 51. An X-stage bottom plate 51c of the X stage 51 is guided by air by an air pad (not shown). Therefore, the X stage 51 can move in the X and Y directions without causing any friction on the surface of a platen 55. The driving force for moving the stage 51 in the X direction is generated by a linear motor placed on a beam 54b of a Y stage 54. A stator 51d of this linear motor has a coil. A magnet as a movable element of the linear motor is attached to the lower surface of the top plate 51a of the X stage 51. Accordingly, when an electric current is allowed to flow through the coil, the magnet generates a driving force in the X direction.

The driving force for moving the Y stage 54 in the Y direction is generated by a linear motor attached to the platen 55. A stator 51e of this linear motor has a coil. A magnet 54c as a movable element of the linear motor is attached to the end portion of a connecting plate 54d connected to the beam 54b of the Y stage 54. When an electric current is allowed to flow through the coil, the magnet generates a driving force in the Y direction. As described above, the Y stage 54 can move along the side surface of a fixed Y guide 52 fixed on the platen 55. The Y-direction driving force is given via an X-direction guiding portion by using the side surface of the beam 54b as a reference surface. An air pad is also used in this X-direction guiding portion.

A cylindrical fixed member 202 and guiding member 203 shown in FIG. 11 correspond to a mechanism which transmits, to the top plate 31, the driving force for moving the X stage 32 shown in FIG. 9 in the X and Y directions. The fixed member 202 and guiding member 203 are guided in a non-contact state by air, and the forces are transmitted to these members via air. By the transmission of these forces, a wafer can be moved to a target position.

The $\theta$ZT driving mechanism 200 shown in FIG. 11 will be explained below. A base 151 is placed on the X stage 51 shown in FIG. 10. The base 151 has the cylindrical fixed member 202. A porous pad 207 held by the fixed member 202 supports, in a non-contact state, the inner circumferential surface of the guiding member 203 attached to a top plate 204 which is equivalent to the top plate 31 shown in FIG. 9 and holds a wafer and wafer chuck (not shown). The top plate 204 can rotate around the central axis of a $\theta$ linear motor (not shown) mounted on the base 151, and can also move up and down in FIG. 11 by Z linear motors 215a equally spaced in the circumferential direction.

To move the top plate on which a substrate such as a wafer is mounted to predetermined X- and Y-coordinates, the conventional alignment apparatus moves the base in the X and Y directions by the X-Y stage while controlling the X- and Y-coordinates of the top plate by using laser interferometers. The top plate is moved to the predetermined position by receiving the driving forces from the base via an air film of a radial air bearing. Although the top plate and base desirably move together, the driving force which the top plate as a holding plate receives produces a phase delay, with respect to the movement of the base, by the contraction of the air film of the hydrostatic bearing.

Instead of this radial air bearing, therefore, a Lorentz force actuator (linear motor) used in the $\theta$ZT driving mechanism can be used as an X-Y driving mechanism. However, a Lorentz force actuator (linear motor) capable of generating a force which can withstand the weight and acceleration of the top plate and the wafer and wafer chuck mounted on the top plate is large. This makes it difficult to satisfy a motor size (downsizing) and motor heat generation (low heat generation) at the same time.

By contrast, Japanese Patent Application Laid-Open No. 2003-022960 discloses an electromagnetic actuator using an electromagnet, as an actuator which can withstand acceleration and generates little heat.

Unfortunately, this electromagnetic actuator using an electromagnet has an iron core formed by stacking silicon steel plates as electromagnetic steel plates, and thereby has the problem that cut portions formed when the electromagnetic steel plates are processed are rusted. This rust contaminates wafers.

Also, in an electromagnetic actuator using an electromagnet in a vacuum environment, varnish (having the effect of adhesion) is used to adhere the individual silicon steel plates. As shown in FIG. 13, however, this varnish generates a large amount of gases. In a step-and-scan type scanning projection aligner using EUV (Extreme Ultra Violet) light as exposure illuminating light, hydrocarbon (—CH) contained in the gases blurs a mirror and decreases the reflectance of the mirror. As a consequence, the necessary exposure amount can be obtained no longer, and the productivity of micropatterning of semiconductor elements lowers.

In addition, to realize a high productivity, a wafer must be moved at a high speed, and this requires a large acceleration. To apply a large acceleration to the top plate 204 of the θZT driving mechanism 200 shown in FIG. 11, a large acceleration must also be transmitted to the base 151. To this end, it is necessary to raise, for example, the driving force of the Y linear motor 41 shown in FIG. 9. The increased driving force is transmitted to the X stage having the base 151 via the X guide 33. If an air guide is used, similar to the air guide of the θZT driving mechanism 200 as described above, a phase delay is produced by the contraction of the air film of the hydrostatic bearing, so the top plate and base cannot move together. Furthermore, since the accelerating force is large, the supporting force of the air guide becomes smaller than this accelerating force. This makes the air guide unable to function as a guide any longer.

When a large acceleration is necessary, therefore, it is possible to use an electromagnetic actuator which withstands acceleration, generates little heat, and has an iron core formed by stacking electromagnets, similar to the θZT driving mechanism. However, this electromagnetic actuator still has the problems of rust formed on the cut portion of the guide surface of the iron core and gases generated from varnish for fixing the electromagnets.

SUMMARY OF THE INVENTION

The present invention has been made in consideration of the above problems, and has as its object to provide a highly reliable iron core and the like.

According to the first aspect of the present invention, there is provided an iron core comprising a stacked structure of a plurality of electromagnetic steel plates having a first region in which an insulating film is formed and a second region from which the insulating film is removed by machining, and a coating member which coats at least the second region.

According to the second aspect of the present invention, there is provided an alignment apparatus comprising a stator and a movable element opposing the stator, wherein a coil is wound around at least one of the stator and movable member.

According to the third aspect of the present invention, there is provided an exposure apparatus comprising an optical system which projects, onto a substrate, exposure light which illuminates an original having a pattern formed thereon, and the alignment apparatus described above.

According to the fourth aspect of the present invention, there is provided a method of manufacturing an iron core, comprising a stacking step of forming a stacked structure by stacking a plurality of electromagnetic steel plates having an insulating film, a machining step of machining at least one side, which is formed in the direction that stacks the electromagnetic steel plates, of the stacked structure, and a coating step of coating a region from which the side of the stacked structure is machined with a coating member.

According to the fifth aspect of the present invention, there is provided a method of manufacturing an iron core, comprising a stacking step of forming a stacked structure by stacking a plurality of electromagnetic steel plates having an insulating film, a machining step of machining at least one side, which is formed in the direction that stacks the stacked structure, of the stacked structure, a disassembly step of disassembling the stacked structure, a coating step of coating, with a coating member, a region of the disassembled electromagnetic steel plates from which the side of the stacked structure is machined, and a stacking step of forming a stacked structure by stacking a plurality of electromagnetic steel plates having the coating.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 1A and 1B are views showing the arrangement of an iron core according to the first preferred embodiment of the present invention;

FIGS. 2A and 2B are views showing the arrangement of an iron core according to the first preferred embodiment of the present invention;

DETAILED DESCRIPTION OF THE PREFERRED EMBODIMENTS

Figure 3A:
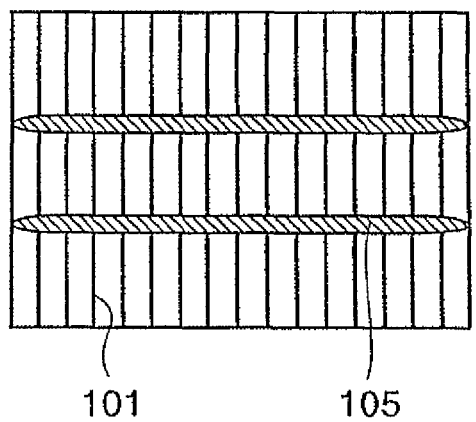
FIGS. 3A and 3B are views showing a method of fixing stacked electromagnetic steel plates.

Preferred embodiments of the present invention will now be described in detail in accordance with the accompanying drawings.

First Embodiment

FIGS. 1A and 1B are views showing an iron core according to the first preferred embodiment of the present invention. FIG. 1A is a sectional view taken along a line a-a' in FIG. 1B. As shown in FIGS. 1A and 1B, the iron core according to this embodiment includes a stacked structure of a plurality of electromagnetic steel plates 101 having a first region in which an insulating film 102 is formed and a second region from which the insulating film 102 is removed by machining, and a coating member 103 which coats at least the second region. The machining includes, for example, cutting, grinding, and lapping. The stacked structure of the electromagnetic steel plates 101 can be formed by stacking N electromagnetic steel plates 101 into the form of a block and, in order to obtain necessary surface accuracy, performing machining such as grinding or cutting on at least one side, which is formed in the direction that stacks the stacked structure, of the stacked structure. To increase the adhesion of the coating of polyimide, polyparaxylene, amorphous silicon, or nickel, all surfaces except for the necessary-accuracy surface desirably undergo machining. By this overall machining, it is possible to remove an oxide film produced during annealing and the overflow of varnish, and further reduce the amount of gases.

The coating member 103 such as polyimide, polyparaxylene, amorphous silicon, or nickel is used to coat at least the machined surface of the surfaces of the stacked structure. Even when the overall machining described above is not performed, not the machined surface alone but all surfaces can be coated with the coating member 103 such as a resin or inorganic layer. In the stacked structure including a portion having the machined surface, at least this machined portion is coated with the coating member 103 as described above. This achieves a remarkable effect of preventing rust from that portion of the steel plate, which has the machined surface.

After the stacked structure is formed by stacking N electromagnetic steel plates 101, varnish is generally used to prevent disintegration of this stacked structure or prevent the scrap or processing solution of grinding or cutting from entering between the electromagnetic steel plates 101. Unfortunately, varnish generates gases in a vacuum environment or in a nitrogen ambient or helium ambient. In this preferred embodiment of the present invention, however, the coating member 103 such as a polyimide or polyparaxylene resin, amorphous silicon, or nickel coats a portion in which the surface of the adhesive member such as varnish is exposed. This prevents the generation of gases from the portion in which the surface of the adhesive member is exposed.

As the varnish, coil-impregnating varnish containing an epoxy resin or polyester resin as its main component is used. In this embodiment, to further suppress the generation of gases, it is preferable to use an epoxy-based adhesive member 105 having a high heat resistance against the temperature of coating. Also, this adhesive member is desirably a thermosetting material having a high glass transition point. The viscosity of such an adhesive member is generally high. Therefore, it is desirable to decrease the thickness of the adhesive layer by diluting the adhesive with an organic solvent, thereby preventing a decrease in volume ratio of iron.

In addition, although the machined surface readily rusts, this rust can be prevented by a coating using a polyimide or polyparaxylene resin, amorphous silicon, or nickel.

Polyimide and polyparaxylene resins are organic materials but have characteristics that they cause little gas generation which is a problem in a vacuum environment or in a nitrogen ambient or helium ambient. Accordingly, it is possible to seal, by this polyimide or polyparaxylene resin, gas materials generated from the adhesive member such as varnish during the course of manufacture, and suppress the generation of gases from the polyimide or polyparaxylene resin itself at the same time. From the viewpoint of gas generation, therefore, the electromagnetic steel plates 101 are regarded as replaced with the resin made of polyimide or polyparaxylene.

Figure 13:
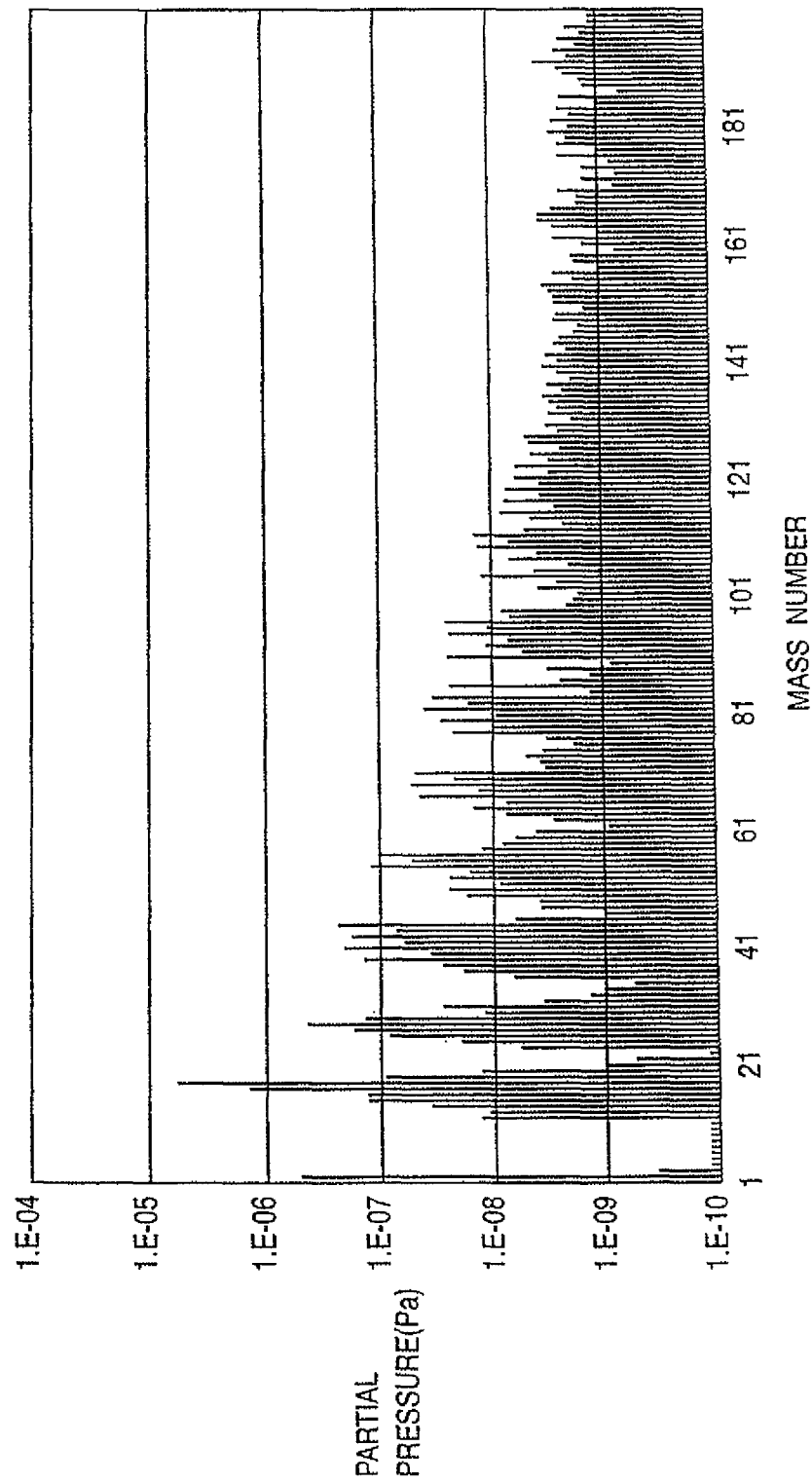
FIG. 13 is a graph showing the results of measurements of gases generated from a conventional stacked structure.

To confirm the coating effect described above, quadrupole mass spectrometry was used to measure the amount of gases generated from the stacked structure formed by stacking the electromagnetic steel plates 101. FIG. 13 is a graph showing gases generated from the stacked structure with no coating on it. In this graph, the abscissa indicates the mass number, and the ordinate indicates the gas amount. In an EUV exposure apparatus, reducing hydrocarbon in a vacuum environment suppresses blur of an optical element and extends the life of an optical system. To reduce hydrocarbon, it is necessary to reduce the amount of gases having a mass number of 44 or more.

Figure 14:
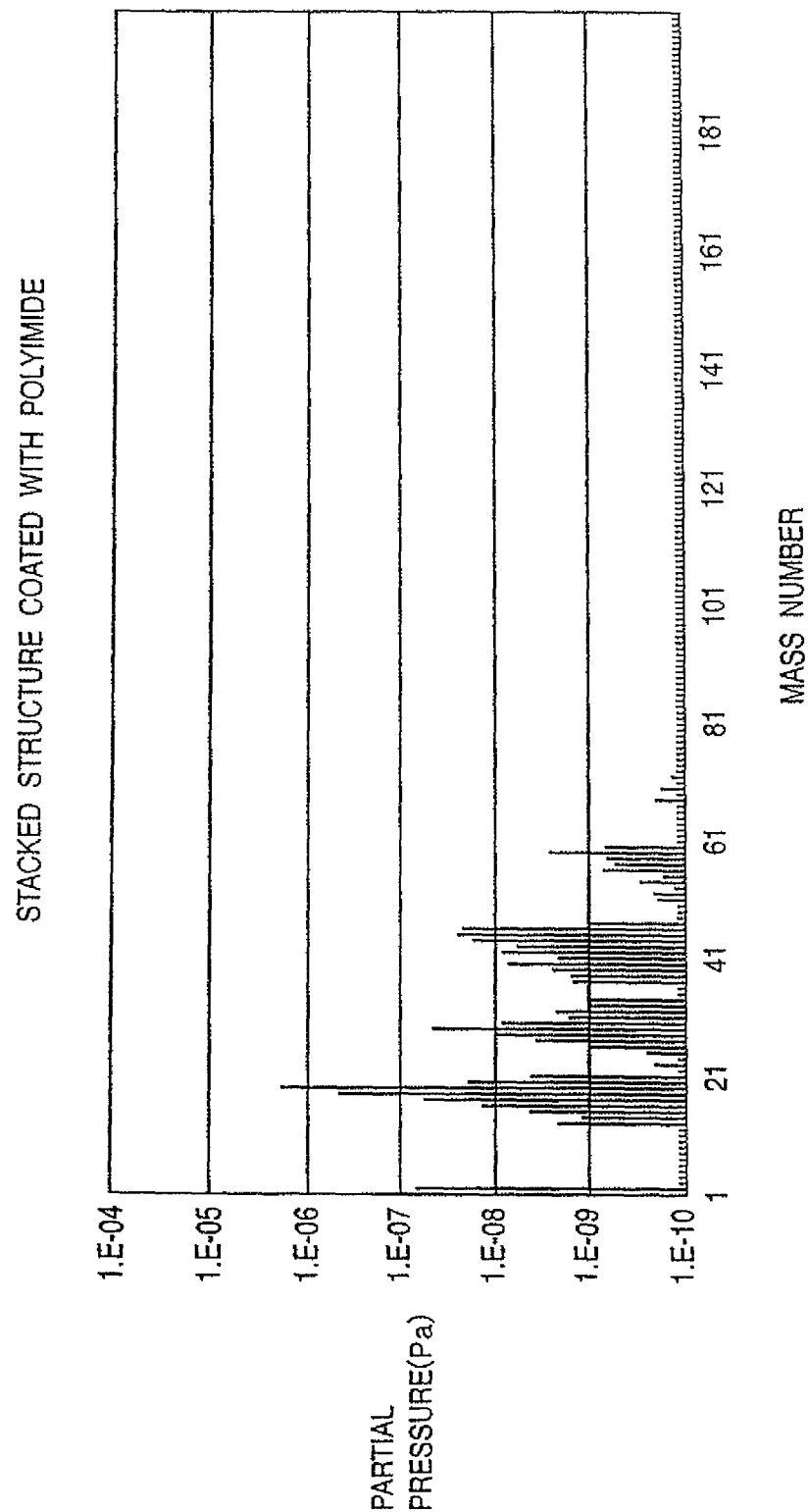
FIG. 14 is a graph showing the results of measurements of gases generated from a stacked structure of the present invention.
Figure 15:
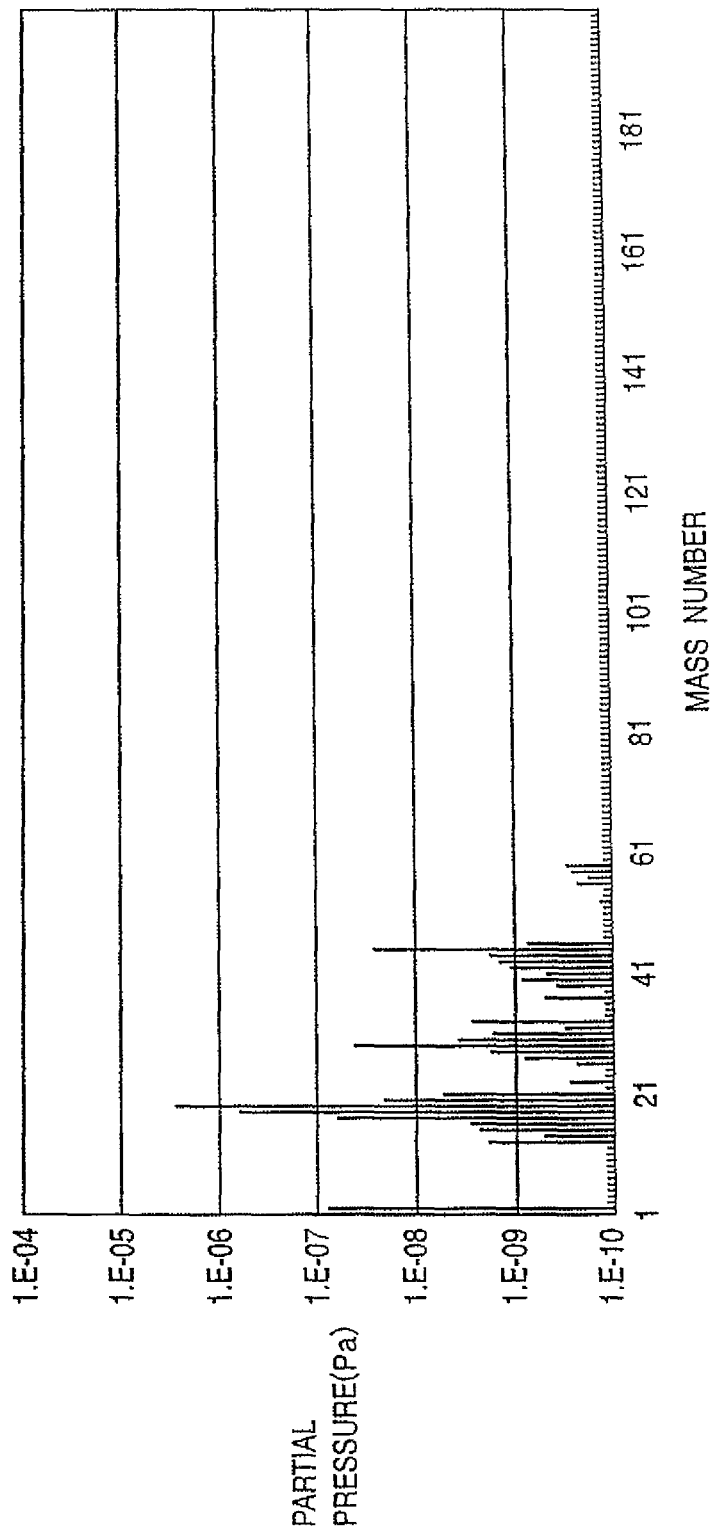
FIG. 15 is a graph showing the results of measurements of gases generated from a stacked structure of the present invention.

As shown in FIG. 13, a large amount of gases is generated when the mass number is 44 or more. In contrast, when the polyimide coating process according to the preferred embodiment of the present invention is performed, gases are sharply reduced as shown in FIG. 14. Likewise, when the amorphous silicon coating process is performed, gases are remarkably reduced as shown in FIG. 15. Since the processing temperature of amorphous silicon is lower than that of polyimide, the range of selection of adhesive members such as varnish widens. Comparison of FIGS. 14 and 15 also shows that the amorphous silicon coating process is superior to the polyimide coating process, so amorphous silicon is a thin film material suited as the coating member 103.

Figure 6:
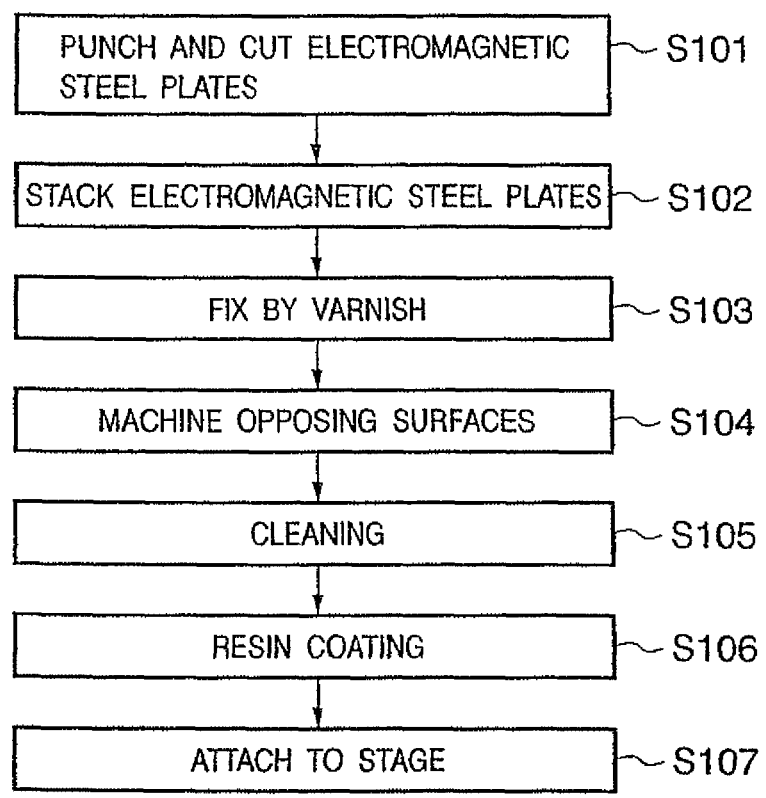
FIG. 6 is a flow chart showing the flow of manufacture of the iron core according to the first preferred embodiment of the present invention.

A method of manufacturing the iron core shown in FIGS. 1A and 1B will be described below. FIG. 6 is a flow chart for explaining the iron core manufacturing method according to the first preferred embodiment of the present invention.

In step S101, electromagnetic steel plates 101 are punched and cut into a predetermined shape such as an E-, U-, or I-shape. As the principal material of the electromagnetic steel plates 101, silicon steel plate, permalloy, or the like can be used. As the method of cutting the electromagnetic steel plates 101, pressing, wire cutting, or the like can be used. It is also preferable to perform magnetic annealing in order to prevent deterioration of the magnetic characteristics caused by cutting.

In step S102, a stacked structure is formed by stacking the electromagnetic steel plates 101 by using an assembly jig.

In step S103, vacuum impregnation using varnish is performed to fix the stacked structure by adhesion. It is also possible to coat each of the electromagnetic steel plates 101 with a heat-resistant epoxy-based adhesive member, stack the electromagnetic steel plates 101 again, and thermally set them.

In step S104, portions serving as opposing surfaces are machined. To prevent deterioration of the magnetic characteristics by this machining, the machining method is preferably grinding by which the amount of removal at one time is small. It is also desirable to perform metal processing on all the six surfaces in order to improve the adhesion of a thin film in step S106.

In step S105, cleaning is performed to remove the machining scrap and processing solution.

In step S106, the stacked structure is coated with a polyimide or polyparaxylene resin or amorphous silicon. Since the gap reduces if the film thickness is large, the film thickness including the flatness is desirably 30% or less of the gap (between the movable element and stator) of the opposing iron cores. The film thickness of a polyimide or polyparaxylene resin is not particularly limited. For example, the gap is 1 to 100 µm, and preferably, 1 to 20 µm.

In the above description, the flatness is 20% or less of the gap. However, in order that the total flatness after coating be 30% or less even when the gap is narrow, portions serving as the opposing surfaces must be accurately finished in advance in step S104.

In step S107, the stacked structure coated with the resin is mounted on the stage or the like according to this embodiment.

Figure 3B:
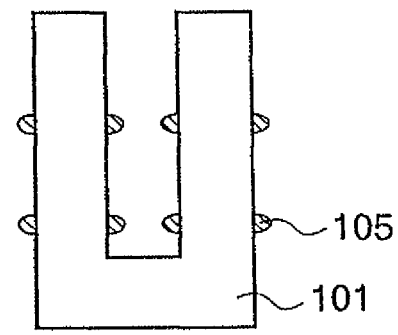

Although varnish is used to fix the stacked structure in step S103, this stacked structure may also be fixed by adhesive fixing members 105 by welding as shown in FIGS. 3A and 3B. FIG. 3A is a side view of the welded stacked structure, and FIG. 3B is a plan view of the welded stacked structure. Unfortunately, machining in step S104 has the problem that the machining scrap and processing solution enter between the electromagnetic steel plates 101. It is extremely difficult to completely remove these scrap and solution even when cleaning is performed in step S105, and this causes the generation of gases. In the preferred embodiment of the present invention, however, this problem can be solved by coating the stacked structure with a polyimide or polyparaxylene resin in step S106.

As described above, when the gap is narrow, portions serving as the opposing surfaces must be accurately finished. In a case like this, as shown in FIGS. 2A and 2B, at least one end face of the stacked structure may also be fixed to a mounting base 104 beforehand. In this case, the coating member 103 desirably coats the mounting base 104. FIG. 2A is a sectional view taken along a line a-a' in FIG. 2B. This facilitates the processing and improves the processing accuracy. Also, errors of assembly to the mounting base 104 reduce, and this further raises the accuracy.

In this arrangement, the stacked structure can be coated with a polyimide or polyparaxylene resin, amorphous silicon, or nickel together with the mounting base 104. Since the coating temperature of polyimide is high, it is desirable to use an iron-based mounting base 104 by taking account of the thermal expansion of the mounting base 104 and electromagnetic steel plate 101. Polyparaxylene is processed at room temperature, so the material of the mounting base 104 may be, for example, ceramics. The technical scope of the present invention incorporates an arrangement in which a thin film is formed on all the surfaces of the stacked structure, if a portion of the mounting surface or the like of the mounting base 104 is masked and not coated with any thin film.

Figure 7:
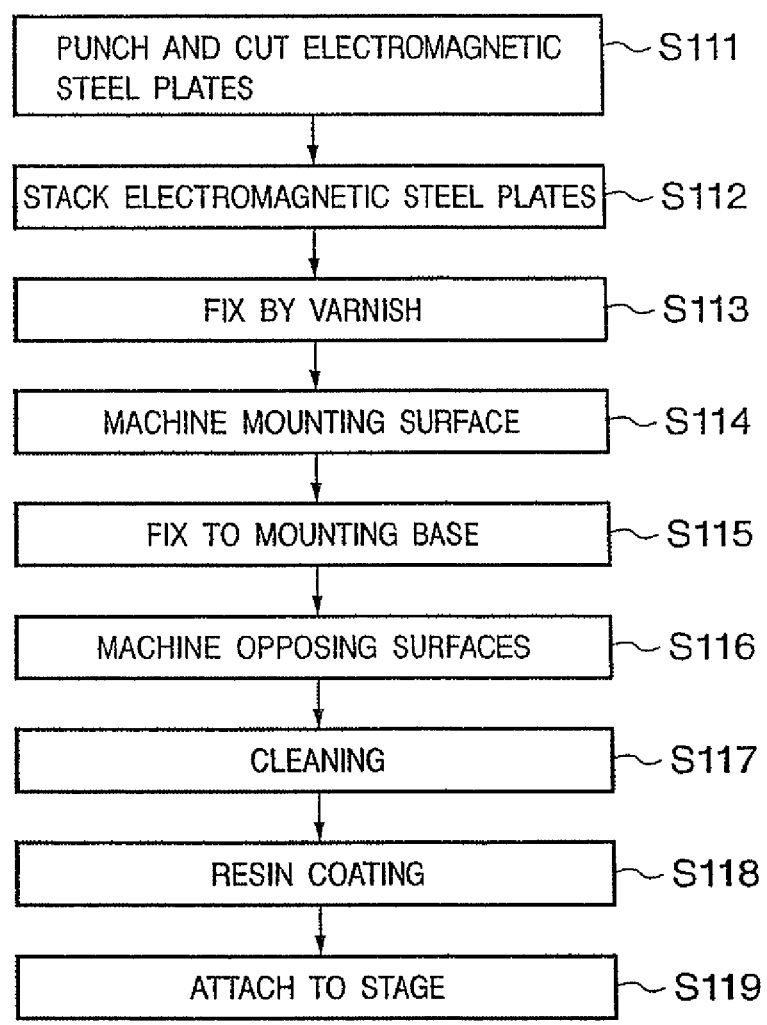
FIG. 7 is a flow chart showing the flow of manufacture of the iron core according to the first preferred embodiment of the present invention.

Another method of manufacturing the iron core shown in FIGS. 2A and 2B will be described below. FIG. 7 is a flow chart for explaining this iron core manufacturing method according to the first preferred embodiment of the present invention.

In step S111, as in step S101 shown in FIG. 6, electromagnetic steel plates 101 are cut into a predetermined shape and undergo magnetic annealing.

In step S112, a stacked structure is formed by stacking the electromagnetic steel plates 101 by using an assembly jig.

In step S113, the stacked structure formed in step S112 is fixed by adhesion by using varnish or the like.

In step S114, to fix the stacked structure to the mounting base 104, the surface (mounting surface) to be fixed of this stacked structure is machined.

In step S115, the stacked structure is fixed to the mounting base 104. As the fixing method, it is possible to use mechanical clamping, an adhesive, or the like.

In step S116, portions serving as opposing surfaces are machined with reference to the bottom surface of the mounting base 104.

In step S117, cleaning is performed to remove the machining scrap and processing solution.

In step S118, as in step S106 of FIG. 6, the resultant structure is coated with a polyimide or polyparaxylene resin or amorphous silicon. In this step, the whole structure including the mounting base 104 is preferably coated. The adhesive member used to fix the mounting base is also coated with this polyimide or polyparaxylene resin, amorphous silicon, or nickel. Accordingly, the generation of gases from the adhesive member can be prevented.

In step S119, the resin-coated stacked structure with the mounting base 104 is attached to the stage or the like.

In this embodiment, the processed surfaces of electromagnetic steel plates are coated with a resin such as polyimide or polyparaxylene or with an inorganic material such as amorphous silicon, thereby forming a thin film which can realize a small gap amount. This makes it possible to prevent rust from the machined surfaces, and seal gases generated from the adhesive member.

Second Embodiment

Figure 16A:
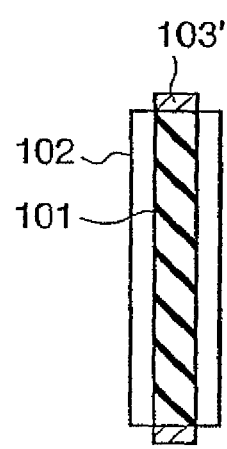
FIGS. 16A and 16B are views showing the arrangement of an iron core according to the second preferred embodiment of the present invention.
Figure 16B:
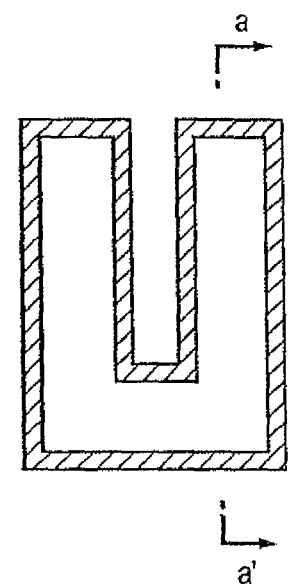

FIGS. 16A and 16B are views showing the concept of the arrangement of an iron core according to the second preferred embodiment of the present invention. In FIGS. 16A and 16B, the same reference numerals as in the first embodiment described above denote the same parts. FIG. 16A is a sectional view taken along a line a-a' in FIG. 16B.

As shown in FIGS. 16A and 16B, at least one surface of an electromagnetic steel plate forming a stacked structure is machined, and the exposed surface is processed by plating 103' using zinc phosphate, magnesium phosphate, electroless nickel, or the like. For example, a surface having chemical nickel plating (electroless nickel plating; KN) 103' is a dense metal film which does not absorb water and the like and does not generate any gases. In addition, an insulating effect can also be obtained because zinc phosphate, magnesium phosphate, and manganese phosphate are materials similar to an insulating film 102 formed on the surface of an electromagnetic steel plate 101. Plating to be used can be selected on the basis of the necessary magnetic characteristics of the iron core. It is, of course, also possible to prevent corrosion of the underlying electromagnetic steel plate 101 by this plating.

Figure 17A:
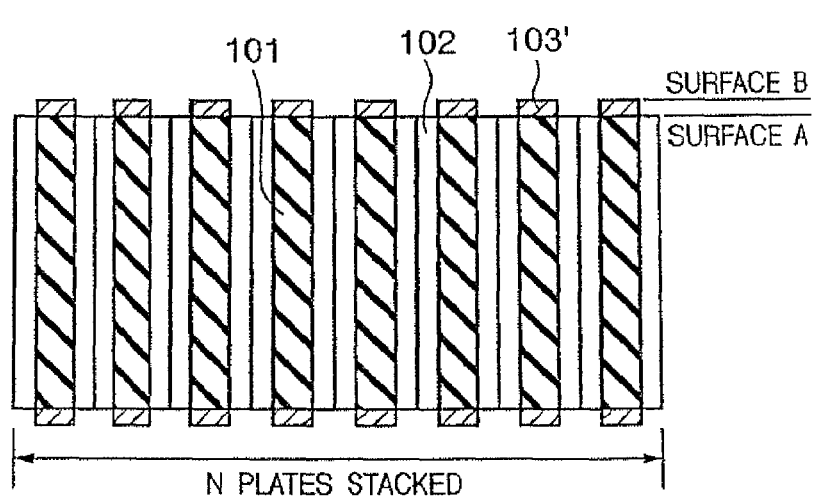
FIGS. 17A and 17B are views showing the arrangement of an iron core according to the second preferred embodiment of the present invention.
Figure 17B:
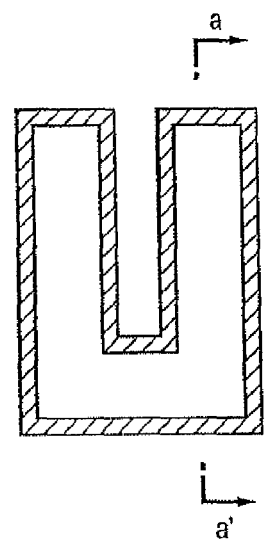

FIGS. 17A and 17B are views showing a stacked structure formed by stacking N electromagnetic steel plates 101 having undergone the plating process described above. This stacked structure is used as, for example, an iron core of an electromagnet coupling or electromagnet guide shown in FIG. 4. Since the electromagnetic steel plates 101 themselves have no adhesive effect, they are preferably chemically clamped after stacked. A surface A shown in FIG. 17A is desirably finished to have flatness with necessary accuracy before plating, as a portion serving as an opposing surface. Zinc phosphate, magnesium phosphate, electroless plating, or the like according to this embodiment evenly coats (plates) the surface A to form a surface B. Since the surfaces A and B are parallel and the flatness of the surface A is maintained on the surface B, the necessary accuracy is maintained even when the stacked structure is once disassembled to pieces and then reassembled. Therefore, the flatness does not decrease to eliminate the gap. Also, the plating thickness is about 1 to 3 μm, i.e., smaller than a necessary gap of 30 to 200 μm. This prevents the gap from being eliminated by plating.

Figure 22:
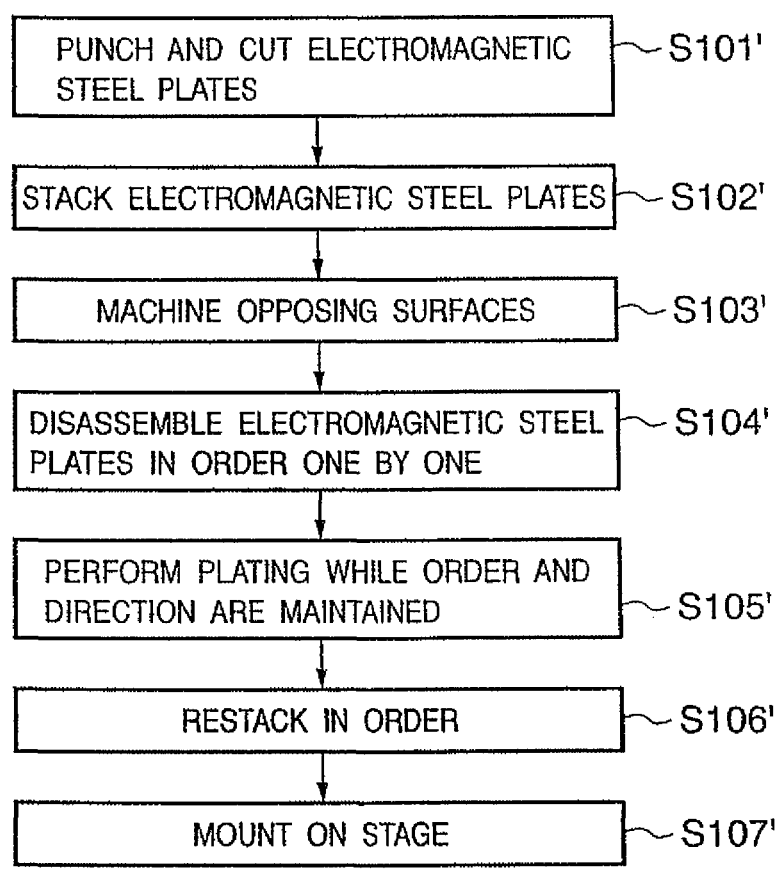
FIG. 22 is a flow chart showing the flow of manufacture of the iron core according to the second preferred embodiment of the present invention.

A method of manufacturing the iron core shown in FIGS. 16A to 17B will be described below. FIG. 22 is a flow chart for explaining a method of manufacturing the iron core according to the second preferred embodiment of the present invention.

In step S101', electromagnetic steel plates 101 are punched and cut into a predetermined shape such as an E-, U-, or I-shape. As the cutting method, pressing, wire cutting, or the like can be used. Also, it is desirable to perform magnetic annealing in order to prevent deterioration of the magnetic characteristics caused by cutting.

In step S102', a block-like stacked structure is formed by stacking the electromagnetic steel plates by using an assembly jig.

In step S103', portions serving as opposing surfaces are machined. To prevent deterioration of the magnetic characteristics by this machining, the machining method is preferably grinding by which the amount of removal at one time is small. In step S103', to ensure reproducibility during reassembly, a surface to be brought into contact with a member for supporting the stacked structure and a surface as the reference of assembly are also machined. It is also desirable to similarly process other surfaces not contributing to assembly, in order to improve the wettability to a plating material.

In step S104', the electromagnetic steel plates 101 stacked in step S102' are removed from the assembly jig and disassembled to pieces. To ensure reproducibility during reassembly in step S106', control is desirably so performed as not to change the stacking order or turn over each plate.

In step S150', plating is performed after cleaning such that the order and direction are maintained.

In step S106', the electromagnetic steel plates 101 in the controlled order are restacked one after another.

In step S107', the stacked structure is mounted on the stage or the like according to this embodiment.

Figure 18A:
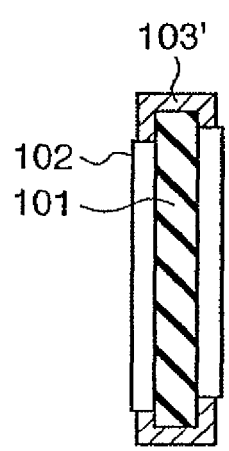
FIGS. 18A and 18B are views showing the arrangement of an iron core according to the second preferred embodiment of the present invention.
Figure 18B:
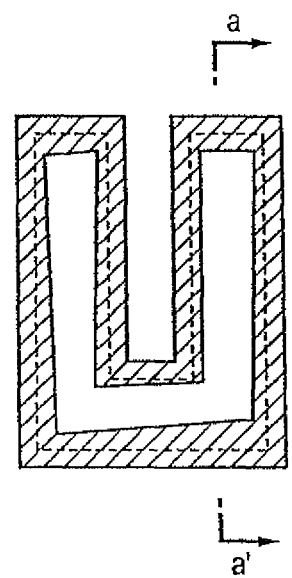

As described previously, an insulating film 102 is formed on the surface of the electromagnetic steel plates 101. As the insulating film 102, zinc phosphate, magnesium phosphate, manganese phosphate, or the like is used. Before the plating process in step S105' of FIG. 22, acid or alkali cleaning is desirably performed to improve the adhesion of plating. However, this cleaning sometimes peels off the insulating film 102, particularly, its outer circumferential portion. In this embodiment, therefore, as shown in FIGS. 18A and 18B, a portion where the insulating film 102 peels off and the surface of the electromagnetic steel plate 101 is exposed is plated by chemical nickel plating or plated with zinc phosphate, magnesium phosphate, or manganese phosphate 103'. This plating coats a portion where the surface of the electromagnetic steel plate 101 is exposed by machining or a portion where the insulating film 102 peels off and the surface of the electromagnetic steel plate 101 is exposed. FIG. 18A is a sectional view taken along a line a-a' in FIG. 18B. Consequently, rust from a portion where the surface of the electromagnetic steel plate 101 is exposed can be prevented.

Figure 20A:
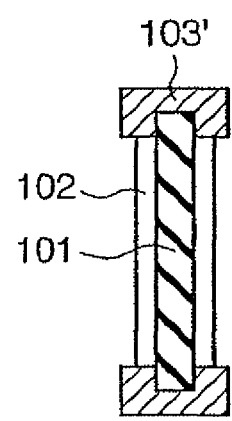
FIGS. 20A and 20B are views showing the arrangement of an iron core when a coating having an appropriate thickness is not formed in the second embodiment.
Figure 20B:
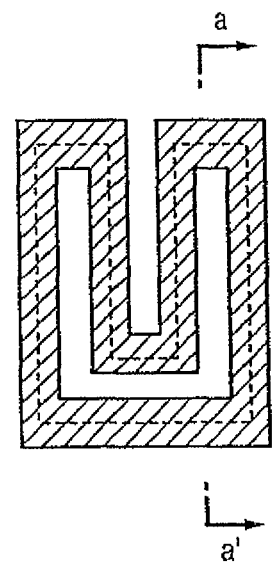
Figure 21:
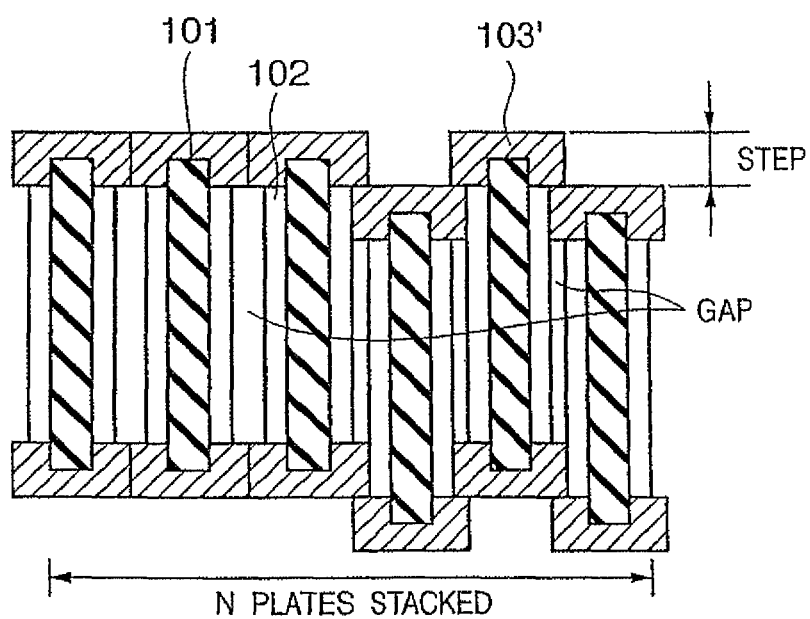
FIG. 21 is a view showing the arrangement of an iron core when a coating having an appropriate thickness is not formed in the second embodiment.

In this step, the thickness of the plating 103' as a coating must be controlled. As shown in FIGS. 20A and 20B, if the plating 103' is formed to exceed the thickness of the insulating film 102 without any film thickness control, the electromagnetic steel plates 101 are restacked in step S106' as shown in FIG. 21, that is, they cannot be correctly aligned. As a consequence, during this restacking, the replated films come in contact with each other before the insulating films 102 of the electromagnetic steel plates 101 come in contact with each other, thereby producing gaps between the electromagnetic steel plates 101. The height of stacking changes in accordance with these gaps. Also, as shown in FIG. 21, no contact reproducibility can be obtained any longer on the stacked surfaces, and this produces steps in the vertical direction. Consequently, no flatness can be maintained.

Figure 19A:
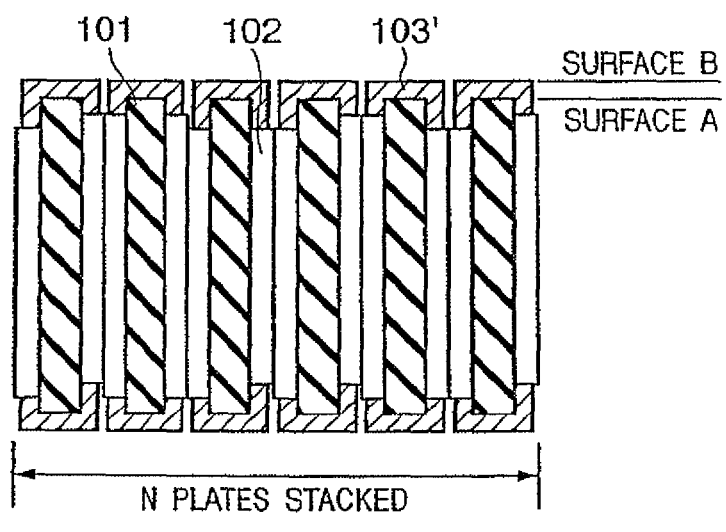
FIGS. 19A and 19B are views showing the arrangement of an iron core according to the second preferred embodiment of the present invention.
Figure 19B:
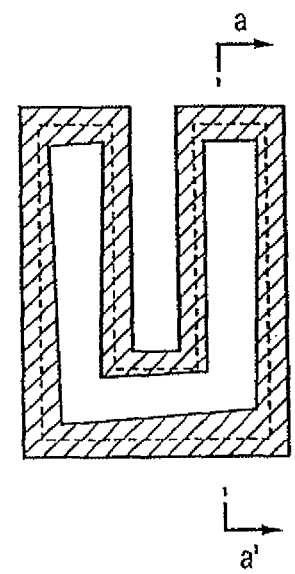

In this embodiment, as shown in FIGS. 18A and 18B, the thickness of the chemical nickel plating 103' as a coating member is controlled to be equal to or smaller than the thickness of the insulating film 102. When restacking is performed in step S106', therefore, the electromagnetic steel plates 101 can be correctly aligned as shown in FIGS. 19A and 19B. FIG. 19A is a sectional view taken along a line a-a' in FIG. 19B. In this manner, flatness can be maintained even in restacking by suppressing changes in height of stacking.

Referring to FIGS. 19A and 19B, similar to FIGS. 17A and 17B, on a surface A which is finished, before plating, to have accuracy required of a portion serving as an opposing surface, a surface B is formed by coating of, for example, zinc phosphate, magnesium phosphate, manganese phosphate, or electroless nickel. The surfaces A and B are parallel, and the flatness of the surface A is maintained on the surface B. Accordingly, the necessary accuracy is maintained even when the stacked structure is once disassembled to pieces and then reassembled.

When the plated electromagnetic steel plates 101 are to be dried after cleaning or baked before put into a vacuum, the processing is desirably performed at 80° C. or less to avoid deformation of the electromagnetic steel plates 101, in order to maintain the assembly reproducibility of restacking.

In this embodiment, a surface exposed by machining or a portion peeled off in the cleaning step before plating is plated with, for example, zinc phosphate, magnesium phosphate, manganese phosphate, or electroless nickel, for each electromagnetic steel plate included in an iron core. This obviates the need for an organic material such as varnish or a coating member required to prevent rust. Also, no gases such as hydrocarbon are generated in a vacuum environment. Therefore, when the iron core according to this embodiment is applied to an exposure apparatus, mirrors are not blurred, and the exposure amount does not decrease, so high productivity can be maintained. In addition, even when the iron core according to this embodiment is applied to an exposure apparatus used in atmosphere, rust from the machined surfaces of the electromagnetic steel plates can be prevented. Accordingly, a highly reliable iron core can be realized.

The film thickness of chemical nickel plating or plating of, for example, zinc phosphate, magnesium phosphate, or manganese phosphate is not particularly limited. For example, this film thickness is preferably about 2 to 6 μm. However, if the assembly reproducibility is low, chemical nickel plating is used. It is also possible to increase the film thickness of chemical nickel plating to about 50 to 100 μm, and machine the surface of chemical nickel plating to obtain an even height. Caution should be exercised during this machining so as not to expose the underlying surfaces of the electromagnetic steel plates 101.

[Alignment Apparatus]

Figure 4:
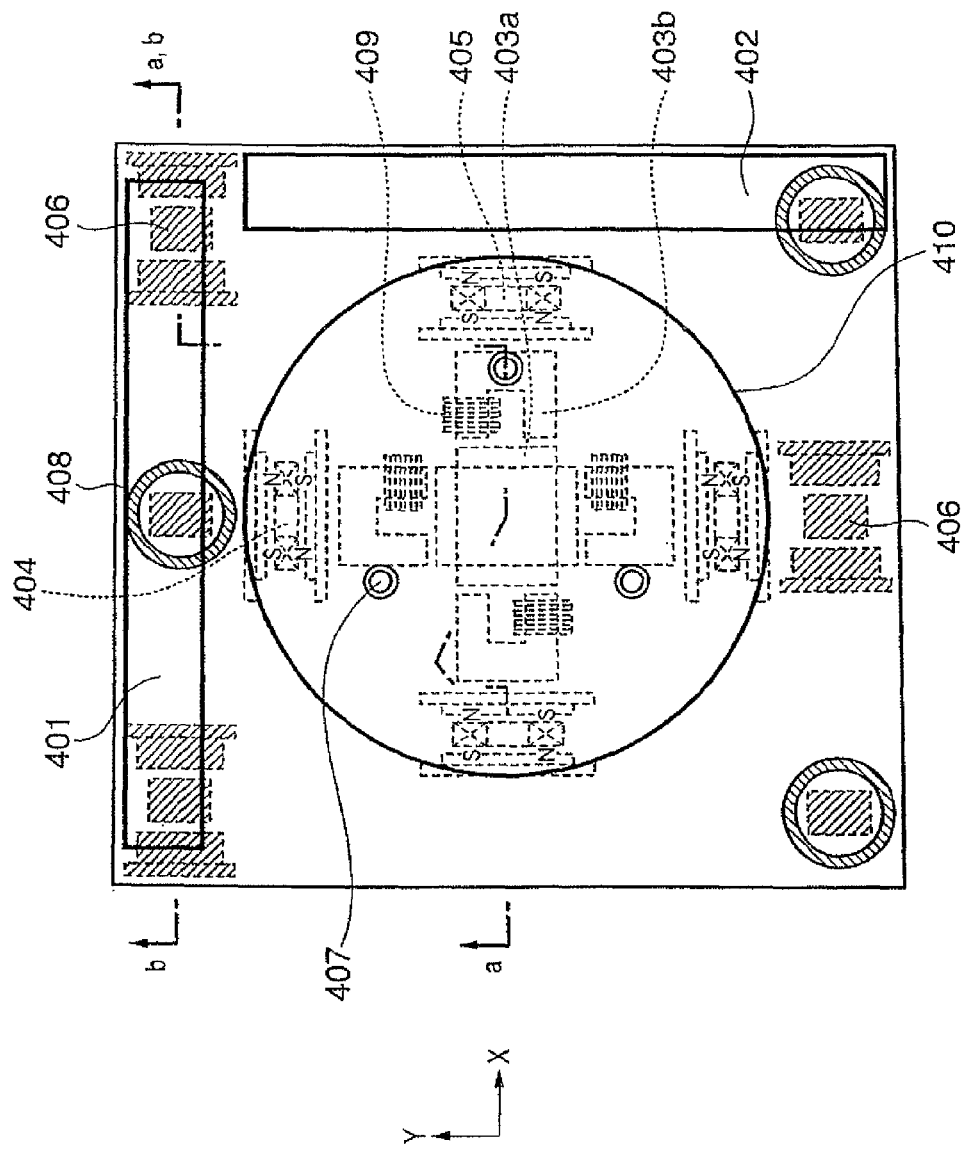
FIG. 4 is a plan view of a wafer stage fine movement unit to which stacked electromagnetic steel plates are applied.
Figure 5:
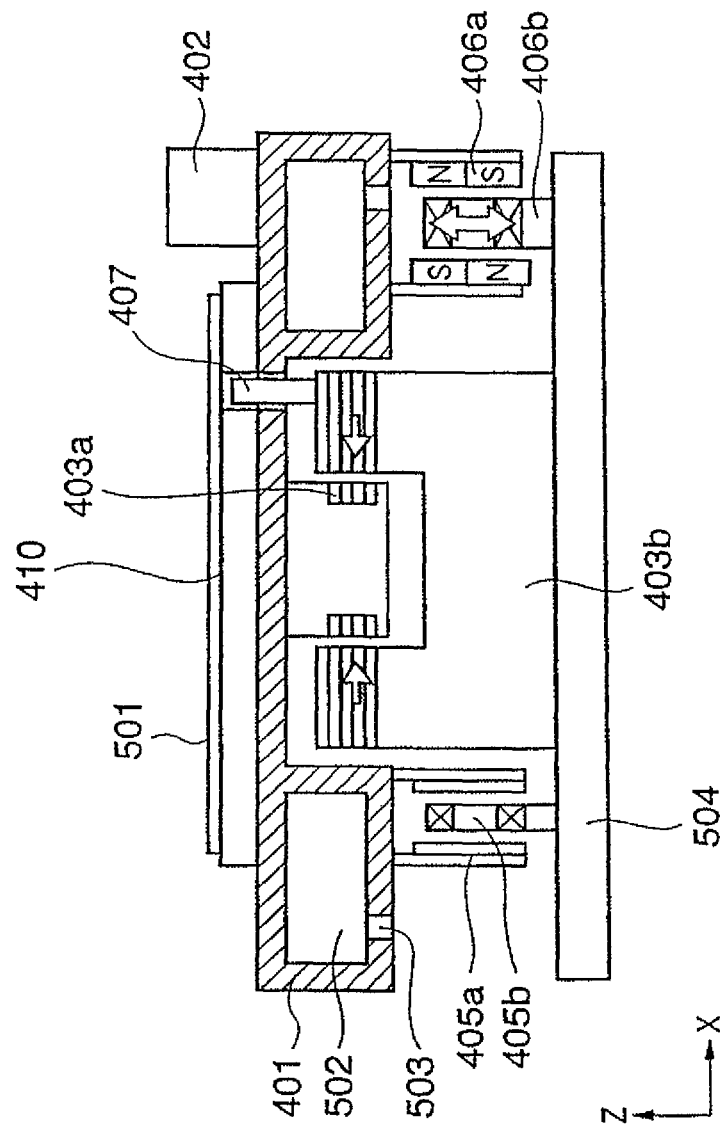
FIG. 5 is a sectional view of the wafer stage fine movement unit to which stacked electromagnetic steel plates are applied.

A stage for driving a substrate to a predetermined position will be explained below as an application of the iron cores according to the first and second preferred embodiments of the present invention. FIGS. 4 and 5 are views showing a fine movement stage using the iron core according to the preferred embodiment of the present invention. FIG. 4 is a plan view, and FIG. 5 is a sectional view.

A hollow top plate 401 contains an SiC composite material, alumina ceramics, or the like. The structure of the hollow top plate 401 is a hollow rib structure in order to achieve both high rigidity and a light weight. On the upper surface of the hollow top plate 401, a wafer chuck 410 is placed to mount a wafer 501 as a substrate. The wafer chuck 410 is fixed to the hollow top plate 401 by, for example, vacuum air or a mechanical clamp (not shown). The wafer 501 is held on the wafer chuck 410 by vacuum air or electrostatic force (not shown).

This alignment apparatus further includes a mirror 402 to measure the relative position of the wafer 501. The mirror 402 is used in the X-axis direction, Y-axis direction, and yawing direction. However, other mirrors may also be arranged to be able to measure the six degrees of freedom. The position of the wafer 501 can be determined by the mirror 402 and a laser interferometer (not shown).

The lower surface of the hollow top plate 401 has an actuator using electromagnetic force and a mechanism for supporting the weight of the hollow top plate 401, in order to move the wafer 501 as a substrate to a predetermined position of the six degrees of freedom. Actuators using electromagnetic force are classified into two types: an electromagnetic coupling which controls accelerating force in the X and Y directions and has the iron core of the present invention, and a fine movement LM which is a Lorentz force actuator for controlling the six degrees of freedom.

Figure 8:
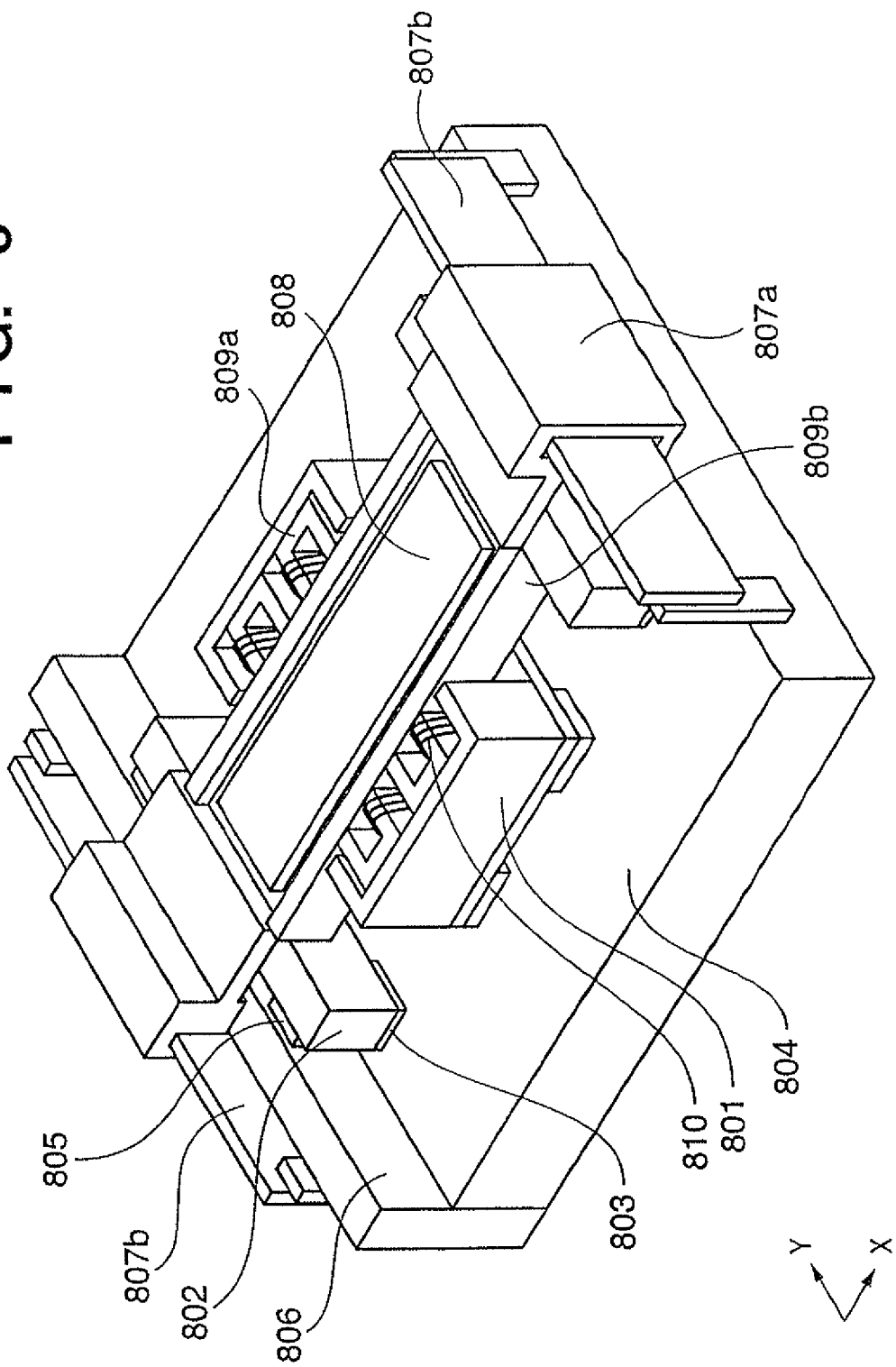
FIG. 8 is a perspective view of a wafer stage coarse movement unit to which stacked electromagnetic steel plates are applied.
Figure 9:
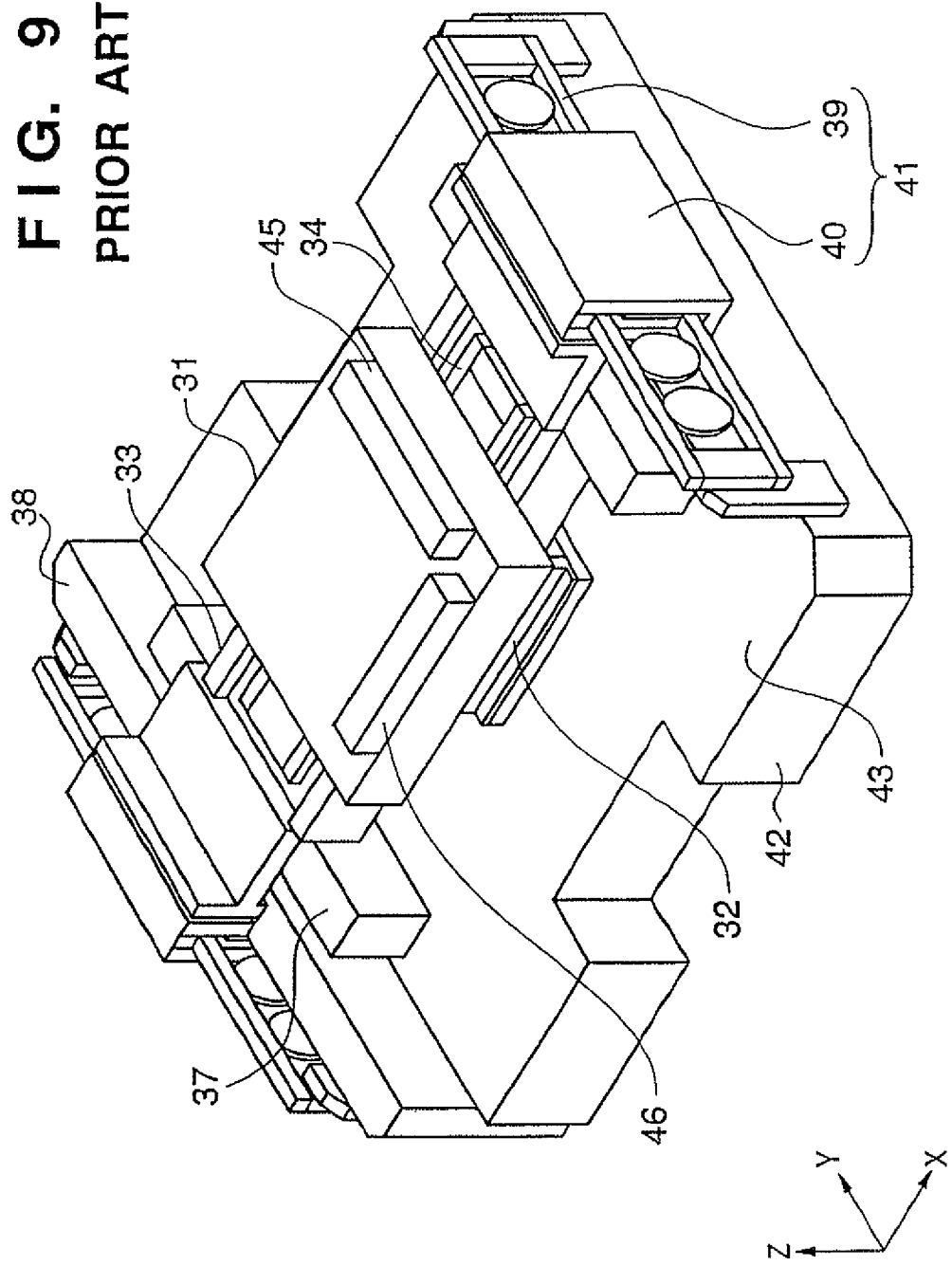
FIG. 9 is a perspective view of a conventional wafer stage.

FIG. 8 shows a state in which the fine movement stage shown in FIGS. 4 and 5 is removed from the whole stage. An X-stage top plate 504 shown in FIG. 5 has a function similar to a top plate 51a of the conventional stage shown in FIG. 11. That is, when the X stage 801 is viewed in the X-axis direction, the X stage 801 and X-stage top plate 504 form a square structure which surrounds a bridge of a Y stage 802.

The stage capable of moving by a long stroke will be described below. The two feet of the Y stage 802 have Y-stage hydrostatic bearings (bottom) 803 which float from a platen 804 when a gas such as air, nitrogen, or helium is supplied. Likewise, the side surface of the Y stage 802 has Y-stage hydrostatic bearings (side) 805 which float from a Y guide 806. By the Y-stage hydrostatic bearings (bottom) 803 and Y-stage hydrostatic bearings (side) 805, the Y stage 802 can move in the Y direction in a non-contact state along the Y guide 806. The moving force (driving force) is generated by two Y actuators (Y linear motor movable elements 807a and Y linear motor stators 807b) arranged on the two sides of the Y stage 802. The Y linear motor movable elements 807a are magnets, and fixed to the Y stage 802. The Y linear motor stators 807b are coils, and fixed to the Y guide 806 and platen 804.

The bridge of the Y stage 802 has an X linear motor stator 808 for generating the moving force (driving force) in the horizontal direction (X direction). An X linear motor movable element (not shown) is placed on the bottom surface of the top plate of the X stage 801. With reference to FIG. 5, the X linear motor movable element is positioned below the X-stage top plate 504.

To move the X stage 801 in the X direction along the bridge side surface of the Y stage 802, an electromagnet which also uses an iron core is used in the preferred embodiment of the present invention. Electromagnet guides (stationary side) 809b are placed on the side surface of the bridge of the Y stage 802, and have surfaces parallel to the X-axis and perpendicular to the platen surface. The X stage 801 has electromagnet guides (movable side) 809a having parallel surfaces corresponding to the bridge side surface described above. The electromagnet guides (movable side) 809a as movable elements and the electromagnet guides (stationary side) 809b as stators are preferably arranged on the two sides of the bridge, because one electromagnet unit can generate only force in the attracting force direction. Electromagnet guide driving coils 810 are wound around the electromagnet guides (movable side) 809a. A predetermined gap is formed between the opposing surfaces of the electromagnet guides (movable side) 809a and electromagnetic guides (stationary side) 809b. For example, this gap is held at about 30 to 200 μm on the both sides, and maintained constant by allowing the same electric current to flow through the electromagnet coils to cause them to pull each other by the same force. As a consequence, the same effect as when an air guide is formed can be obtained.

To move the X stage 801 holding the six-degree-of-freedom top plate on which the wafer is placed in the Y direction, the Y linear motor generates driving force. This driving force is transmitted to the Y stage 802. The driving force is also transmitted to the X stage 801 via the electromagnet guides. To transmit the force to the X stage 801, the electromagnets opposing each other in the moving direction generate force by multiplying the movable element weight of the X stage 801 and six-degree-of-freedom top plate by the moving acceleration, in addition to the force of maintaining the gap. Since this balances the forces, the X stage 801 can be moved in the Y direction without changing the gap.

In this embodiment, the iron core which reduces the generation of gases and prevents rust can be used, so the stage performance can be improved without any damage to an optical system. That is, the moving velocity in the Y-axis direction parallel to the scan direction can be raised. This reduces the scan time and increases the productivity. When the moving velocity in the X-axis direction is similarly raised, the moving time in the X direction when movement or exposure is performed in the X direction during wafer exchange or alignment is reduced, and this further increases the productivity. By increasing the driving force of the X linear motor, the moving velocity in the X-axis direction can be raised. When the driving force of the X linear motor is thus increased, the reaction force must be taken into consideration. The reaction force of the linear motor is received by the Y stage 802 via the X linear motor stator 808, and transmitted to the platen 804 via the Y-stage hydrostatic bearings (side) 805. This problem can be solved by guiding the hydrostatic bearings of the Y guides 806 by electromagnet guides, as in the X stage 801 described above.

The X stage 801 and Y stage 802 in the long stroke portion shown in FIG. 8 also include laser interferometers (not shown). A laser interferometer, which measures in the Y direction, of the X stage 801 has a bar-like shape similar to an optical mirror (for example, the mirror 402) placed on the hollow top plate 401 shown in FIG. 4, and can measure even when the X stage 801 moves in the X direction.

Figure 11:
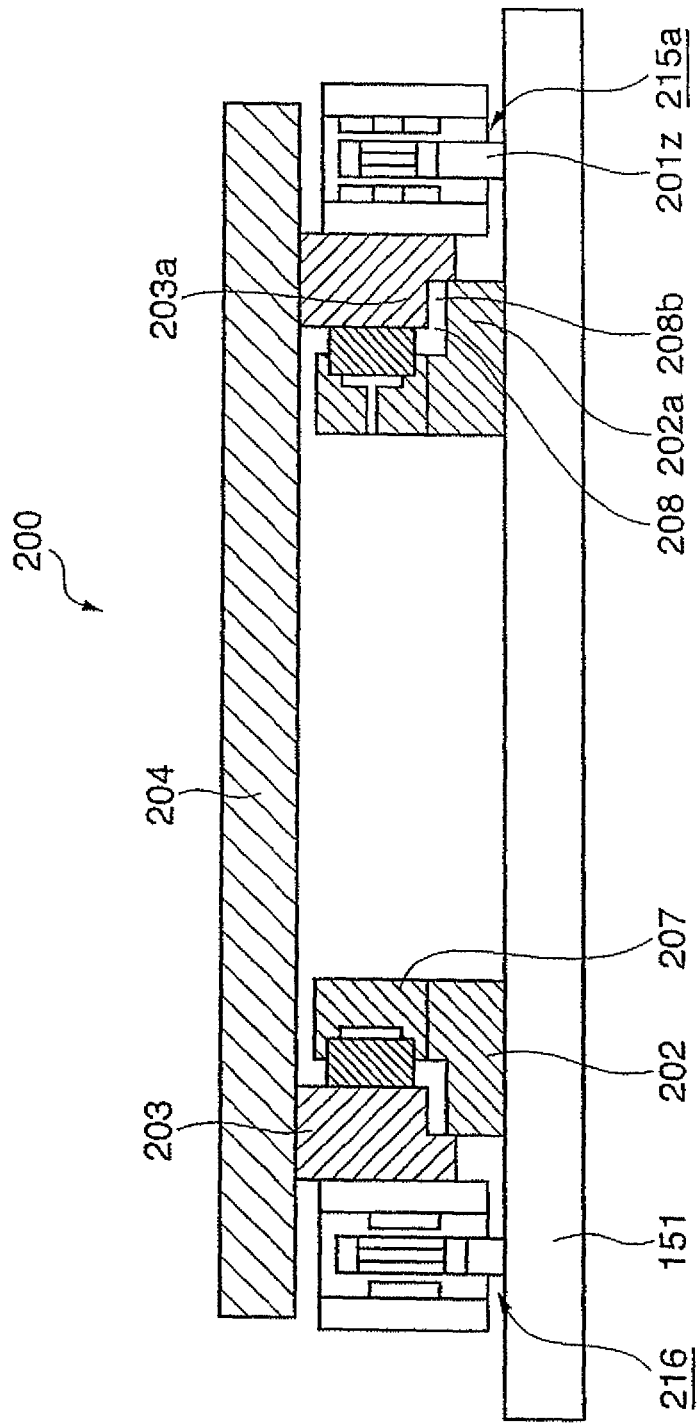
FIG. 11 is a sectional view of a conventional wafer stage fine movement unit.

Conventionally, as shown in FIG. 11, even in final positioning control in the X and Y directions, the wafer position is controlled by long-stroke driving actuators 54c and 51c via radial air bearings. In this embodiment, however, final positioning control in the X and Y directions is performed by the fine movement LMs as Lorentz force actuators on the lower surface of the hollow top plate 401. Therefore, even when the controllability of the long-stroke actuators is lowered, the positioning control is kept at high accuracy as a whole, and the parts cost and adjustment cost can also be reduced.

The fine movable portion including the hollow top plate 401 shown in FIGS. 4 and 5 will be explained below. FIG. 5 is a sectional view taken along a line a-a in FIG. 4. An electromagnetic coupling movable side 403a and electromagnetic coupling stationary side 403b transmit the accelerating force generated by the long-stroke actuator described above to the fine movable portion including the hollow top plate 401 by using electromagnets. Each of the electromagnetic coupling movable side 403a and electromagnet coupling stationary side 403b includes, as an electromagnet, a stacked structure formed by stacking the electromagnetic steel plates 101 into the form of a block. One unit of the electromagnetic coupling movable side 403a and electromagnetic coupling stationary side 403b generates only force in the attracting force direction. As shown in FIG. 4, therefore, two units preferably oppose each other in the X and Y directions. The electromagnetic coupling stationary side 403b is placed in the center of the X-stage top plate 504. The electromagnetic coupling movable side 403a is placed on the hollow top plate 401. From the viewpoints of heat generation and assembly, a coil of this electromagnetic coupling is preferably formed in the electromagnetic coupling stationary side 403b. The electromagnetic steel plates of the electromagnetic coupling stationary side 403b preferably have an E- or U-shape to allow insertion of the coil. Similar to the electromagnetic guide, an appropriate gap is formed between the opposing surfaces of the electromagnetic coupling stationary side 403b and electromagnetic coupling movable side 403a.

As described earlier, the fine movement LMs as Lorentz force actuators are arranged as other actuators on the lower surface of the hollow top plate 401 in order to control the six degrees of freedom. These fine movement LMs are arranged outside the electromagnetic couplings in the X and Y directions. That is, two Y-direction fine movement LMs 405 are arranged on the X axis, and two X-direction fine movement LMs 404 are arranged on the Y axis. Control in the yawing direction is performed by the Y-direction fine movement LMs 405 or X-direction fine movement LMs 404. It is also possible to place one linear motor in the center of gravity of the fine movable portion as the X- or Y-direction fine movement LM. From the viewpoints of heat generation and assembly, the X- and Y-direction fine movement LMs are preferably so arranged that a magnet and yoke are placed on the movable side and a coil which generates heat is placed on the stationary side.

As shown in FIG. 4, to control the Z direction and pitching and rolling directions, three Z-direction fine movement LMs 406 are arranged in the periphery of the top-plate lower surface. Similar to the X- and Y-direction fine movement LMs, the Z-direction fine movement LMs 406 are preferably so arranged that a magnet and yoke are placed on the movable side and a coil which generates heat is placed on the stationary side, from the viewpoints of heat generation and assembly.

In addition, as shown in FIG. 4, weight compensators 408 are equally spaced on the lower surface of the hollow top plate 401. The weight compensators 408 are so designed that the weight of the fine movable portion and the force generated by the weight compensating mechanism are substantially equal. The force difference is produced because the force generated by the weight compensating mechanism changes with respect to the position of the hollow top plate 401 in the vertical direction. This force difference is completely removed by the Z-direction fine movement LMs 406. This force difference causes the Z-direction fine movement LMs 406 to steadily generate a large driving force. To prevent heat generated by these fine movement LMs from worsening the environment around the hollow top plate 401, the force generated by the weight compensating mechanism is well adjusted. To reduce variations in the generated force, it is desirable to use an attracting magnet and compression coil together as the weight compensating mechanism.

Three transfer bars 407 extend from the electromagnetic coupling stationary sides 403b to temporally hold a wafer during wafer exchange. When a wafer is placed on the chuck 410 such as when exposure is performed, as shown in FIG. 4, the wafer lower surface or chuck upper surface is positioned above the upper surfaces of the transfer bars 407. Without any vertical movement of the transfer bars 407, the transfer bars 407 can extend above the chuck upper surface when the entire hollow top plate 401 is moved down by the Z-direction fine movement LMs 406. The wafer can be replaced by lowering the whole hollow top plate to a gap which a transfer hand can enter and leave to transfer wafers.

Figure 10:
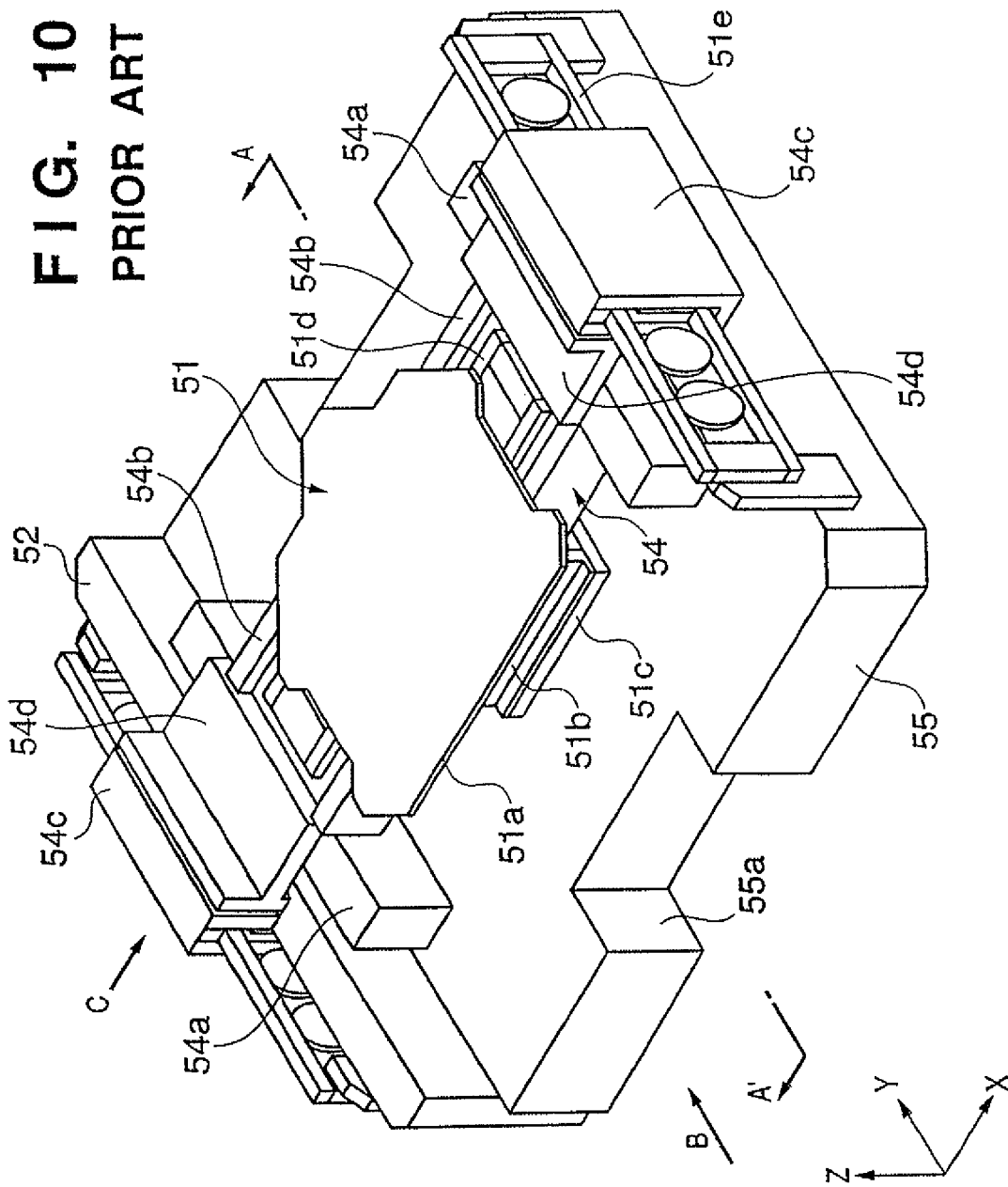
FIG. 10 is a perspective view of a conventional wafer stage coarse movement unit.

The electromagnetic guide in the long-stroke portion will be described in more detail below. In the conventional stage as shown in FIG. 10, the gap always changes because of the passive arrangement using an air pad. By contrast, the electromagnetic guide according to this embodiment can actively control the gap in accordance with the acceleration profile of the Y stage. As a consequence, control can be performed with almost no change in gap.

Even when the electromagnetic guide is used, the gap changes owing to an electrical delay or magnetic hysteresis, although the change is smaller than when an air pad is used. To decrease the magnetic hysteresis, the gap need only be widened. If the gap is widened, however, an electric current necessary for driving increases. When the electric current is increased to be equal to or larger than the saturation flux density of the iron core, the generated force cannot become larger than the force at this saturation flux density any longer. To generate a large force, the size of the opposing surfaces of the electromagnets may be increased. However, if the size of the opposing surfaces is increased, the size of the bridge of the Y stage or the size of the X slider increases, and this increases the weight to be conveyed. Accordingly, the gap is preferably narrowed, but in this case the iron loss of the electromagnetic steel plate or the influence of hysteresis makes control difficult. Therefore, a gap amount matching the allowable control characteristics is set. Although this gap amount is not particularly limited as described earlier, the gap amount is preferably 30 to 200 μm. To maintain this small gap amount, the flatness of the opposing surfaces must be high. If this flatness is low, the force varies and the control characteristics deteriorate as when the gap changes. The opposing surfaces need not be lapped surfaces such as air pad surfaces, but the flatness of these opposing surfaces is desirably 20% or less of the gap having undergone machining such as cutting or grinding.

As described above, a surface having undergone machining such as grinding or cutting is the surface of the electromagnetic steel plate and easily rusts. Also, since the machined surface easily rusts, this rust and the worsening of the environment caused by the rust make it impossible to maintain a predetermined gap any longer. Furthermore, a grinding solution used when machining is performed remains between the electromagnetic steel plates to cause the generation of gases.

In this embodiment, therefore, the iron core according to the first preferred embodiment of the present invention can be applied to an alignment apparatus. More specifically, after a stacked structure is formed by stacking N electromagnetic steel plates 101 as shown in FIG. 1, machining such as grinding or cutting described above is performed, and the machined surfaces are coated with a coating member 103 such as polyamide, polyparaxylene, amorphous silicon, or nickel. This prevents rust of the machined surfaces. It is also possible to reduce the adverse effect of gases generated from varnish generally used when the stacked structure is formed in a vacuum environment, nitrogen ambient, or helium ambient.

In this embodiment, the iron core according to the second preferred embodiment of the present invention can also be applied to an alignment apparatus. More specifically, as shown in FIGS. 16A to 19B, each electromagnetic steel plate 101 forming the iron core undergoes machining such as grinding or cutting, and is coated with plating 103' such as zinc phosphate, magnesium phosphate, manganese phosphate, or electroless nickel. In this plating process, a film of the plating 103' is added to the machined portions. A surface coated with the plating 103' formed by chemical nickel plating (electroless nickel plating) is a dense metal film which does not absorb water and the like and does not generate any gases. On the other hand, a surface coated with the plating 103' formed by zinc phosphate, magnesium phosphate, or manganese phosphate is a material analogous to the insulating film 102 of the electromagnetic steel plate 101, and can achieve the insulating effect. Also, a film made of either material can prevent corrosion of the underlying electromagnetic steel plate 101.

[Exposure Apparatus]

Figure 12:
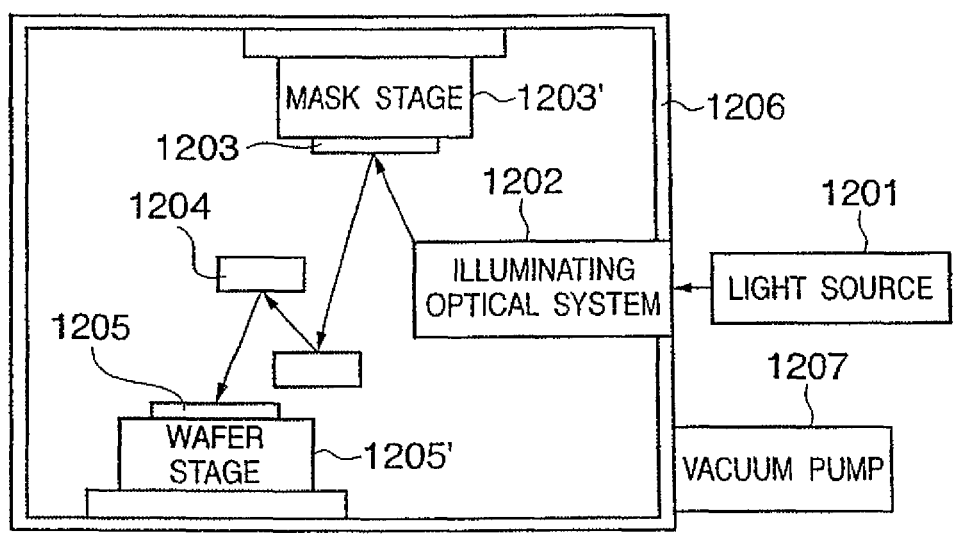
FIG. 12 is a view showing the concept of an exposure apparatus.

FIG. 12 is a schematic view showing the arrangement of an exposure apparatus used in the semiconductor device fabrication process when the above alignment apparatus is applied to this exposure apparatus. Referring to FIG. 12, light emitted from a light source 1201 is projected onto a mask 1203 as a master via an illuminating optical system 1202 placed In a vacuum chamber 1206. The light source 1201 uses EUV light having an oscillation spectrum at, for example, 5 to 15 nm (soft X-ray region) as exposure illuminating light. The mask 1203 is held on a mask stage 1203' including the alignment apparatus according to the preferred embodiment of the present invention. The image of a pattern of the mask 1203 is projected onto a wafer 1205 as a substrate via a projecting optical system 1204. The surface of the wafer 1205 as a sample to be exposed is coated with a resist, and shots formed in the exposure step are arranged on the surface. The wafer 1205 is held by a wafer stage 1205' including the alignment apparatus according to the preferred embodiment of the present invention. A high vacuum degree is held in the vacuum chamber 1206 by a vacuum pump 1207. It is possible to prevent the generation of gases such as hydrocarbon from the electromagnetic steel plates of the wafer stage 1205' and mask stage 1203'. This prevents blur on the mirror surface during EUV exposure, and prevents deterioration of the productivity. Also, a high vacuum degree can be maintained because the generation of gases can be prevented.

As the exposure apparatus, it is possible to use, for example, a step-and-scan type scanning projection aligner in which the mask 1203 and wafer 1205 are so controlled that the wafer 1205 is exposed by scanning. In this step-and-scan type scanning projection aligner, high-speed, high-accuracy stage control is required because the mask 1203 and wafer 1205 must be controlled in synchronism with each other. Since the electromagnetic actuator according to the preferred embodiment of the present invention can prevent the generation of gases and rust, high-speed, high-accuracy stage control can be realized.

Also, even in a conventional exposure apparatus used in atmosphere, rust from the machined surfaces of electromagnetic steel plates can be prevented. Consequently, a highly reliable electromagnetic actuator can be realized.

In the preferred embodiments of the present invention, the gap amount is 30 to 200 μm, and the flatness including the film thickness of the resin is 20% or 30% or less of the gap. However, the present invention is not limited to these values. Even when the gap amount and flatness in the preferred embodiments of the present invention take values other than those described above, similar effects on gases and rust can be obtained by applying the preferred embodiments of the present invention.

Also, the preferred embodiments of the present invention are explained by taking the wafer stage applied to a semiconductor exposure apparatus as an example. However, the present invention is not limited to the wafer stage. For example, the preferred embodiments of the present invention can also be applied to a mask scan stage for moving a mask having a pattern to be transferred onto a wafer. Furthermore, similar effects can be obtained by applying the iron core according to the present invention not only to the wafer stage or mask stage, but also to an electromagnetic steel plate or electromagnet of a motor in a place requiring the prevention of the generation of gases and rust.

As described above, in the exposure apparatus according to this embodiment, a stacked structure is formed by stacking electromagnetic steel plates in the form of an iron core of an electromagnetic actuator. This stacked structure is impregnated with varnish in a vacuum, and the opposing surfaces of a stationary side and movable side are machined. To prevent the generation of gases from the varnish, the generation of gases from the machining scrap or processing solution, and rust on the surface, at least those surfaces of the stacked structure, in which the electromagnetic steel plates are exposed are coated with a coating member such as a polyimide or polyparaxylene resin, amorphous silicon, or nickel. Accordingly, this embodiment can provide a highly reliable iron core.

Also, in the exposure apparatus according to this embodiment, gases such as hydrocarbon generated from the electromagnetic actuator in a vacuum environment or in a nitrogen ambient or helium ambient can be eliminated by the coating of a polyimide or polyparaxylene resin, amorphous silicon, or nickel. Since this prevents blur on the mirror, the exposure amount does not decrease by blur on the mirror, so high productivity can be maintained. This greatly reduces the maintenance cost of the apparatus because the interval of exchange of expensive mirrors can be extended.

As many apparently widely different embodiments of the present invention can be made without departing from the spirit and scope thereof, it is to be understood that the invention is not limited to the specific embodiments thereof except as defined in the appended claims.

What is claimed is:

1. A method of manufacturing an iron core, comprising:
   a stacking step of forming a stacked structure by stacking a plurality of electromagnetic steel plates having an insulating film;
   a machining step of machining at least one side of the stacked structure, the side being formed along a direction in which the electromagnetic steel plates are stacked; and
   a coating step of coating a region which includes a machined surface of the stacked structure machined in the machining step with a coating member which consists of amorphous silicon.

2. A method according to claim 1, further comprising a step of fixing at least one end face of the stacked structure to a mounting base,
   wherein in the coating step, the mounting base is coated with the coating member together with the region.

3. A method of manufacturing an iron core, comprising:
a stacking step of forming a stacked structure by stacking a plurality of electromagnetic steel plates having an insulating film;
a machining step of machining all outer surfaces of the stacked structure; and
a coating step of coating a machined surface of the stacked structure machined in the machining step with a coating member which consists of amorphous silicon.

4. A method of manufacturing an iron core, comprising:
a stacking step of forming a stacked structure by stacking a plurality of electromagnetic steel plates having an insulating film;
a machining step of machining at least one surface of the stacked structure;
a fixing step of fixing at least one end face of the stacked structure to a portion of a mounting base; and
a coating step of coating a region of the stacked structure and the mounting base with a coating member which consists of amorphous silicon, wherein the coated region of the stacked structure and the mounting base includes a machined surface of the stacked structure machined in the machining step, and does not include the at least one end face of the stacked structure and the portion of the mounting base to which the at least one end face is fixed.

* * * * *